United States Patent [19]

Nouvelot et al.

[11] Patent Number: 5,288,328

[45] Date of Patent: Feb. 22, 1994

[54] APPARATUS FOR CONTROLLING A MATERIAL FLOW EMITTED BY A HEATED EVAPORATION SOURCE AND APPLICATION TO A VACUUM EVAPORATION COATING MACHINE

[75] Inventors: Luc Nouvelot, St. Martin d'Heres; Aimé Perrin, St. Ismier, both of France

[73] Assignees: Commissariat A L'Energie Atomique, Paris; Etat Francais Represente Par Le Delegue General Pour L'Armenent, Armees, both of France

[21] Appl. No.: 12,465

[22] Filed: Feb. 2, 1993

[30] Foreign Application Priority Data

Feb. 12, 1992 [FR] France .................. 92 01563

[51] Int. Cl.$^5$ ............................................. C23C 14/24
[52] U.S. Cl. .................................. 118/722; 118/715; 118/726; 118/727
[58] Field of Search ................ 118/715, 726, 727, 722

[56] References Cited

U.S. PATENT DOCUMENTS 3,636,916  1/1972  Thelen et al. .

FOREIGN PATENT DOCUMENTS 2834806  2/1980  Fed. Rep. of Germany .

Primary Examiner—Richard Bueker
Attorney, Agent, or Firm—Oblon, Spivak, McClelland, Maier & Neustadt

[57] ABSTRACT

Source evaporation machine for covering samples optionally by a mixture produced by several sources (3). Mobile covers (6) are placed between the sources (3) and the sample. The covers (6) are designed so as to ensure that the solid parts (23,24) and the openings (21,25) alternate and the sources (3) move relative to the covers in such a way that different circumferences of the covers pass in front of them. As the angular sectors surrounded by the openings differ for each circumference, the degree of hiding of the sources (3) can be regulated in a very accurate and reliable manner. It is possible to modify the flow of the source on the sample or, in the case of several sources, vary the composition of the deposited mixture.

12 Claims, 4 Drawing Sheets

APPARATUS FOR CONTROLLING A MATERIAL FLOW EMITTED BY A HEATED EVAPORATION SOURCE AND APPLICATION TO A VACUUM EVAPORATION COATING MACHINE

DESCRIPTION

The invention relates to a control apparatus for a material flow emitted by a vacuum heated evaporation source and intended to equip a thin film deposition or coating machine using vacuum evaporation and in particular a machine having several sources for depositing a mixture of materials.

It is frequently necessary to control the speed of deposition or, in the case of a simultaneous deposition of several materials to regulate their proportion when it is wished to e.g. regulate the refractive index of a filter. Several methods exist. In one of them, for each source use is made of a quartz balance, which is connected to a servocontrol device, which deduces the evaporation speed from the readings of the balance and controls the variations of the source supply in order to obtain the desired flow rate. This servocontrol is not always adequate, because the response delay of the sources to the supply variations is not accurately known. According to another method, one of the materials is extracted from a source and then projected towards the object to be coated, whereas the other is introduced into the enclosure containing said object by another means, such as a flow of gas or ion bombardment. The first of these methods is not very accurate due to the inertia of the gas flow and their inadequate uniformity in the enclosure and the second requires a special apparatus.

A novel method is proposed with the apparatus according to the invention. It consists of using screens, masks or covers provided with openings and which constantly move in front of the source, so as to present in front of it the openings alternating with the solid parts. The cover is mobile relative to the source in such a way that it makes it possible to vary the degree of source hiding, i.e. the proportion of the time during which the source is covered by the solid parts compared with the total passage time. The flow rate of the source in the direction of the part to be covered is, under these conditions, perfectly defined. The support in which the cover is fitted is preferably mobile relative to that of the source, so that it is possible to continuously vary the hiding level on displacing the source. It is also possible to make the variations of the degree of hiding proportional to the support displacement.

A preferred embodiment of said apparatus comprises several sources and the same number of covers moved by motors. All the covers and motors are mounted on a single plate and the covers are designed in such a way that the displacements of the support relative to that of the sources bring about different variations of the degree of hiding of each source. It is then possible to freely modify the compositions of the deposits made.

The invention is described in greater detail hereinafter relative to non-limitative embodiments and the attached drawings,

BRIEF DESCRIPTION OF THE DRAWINGS

With reference to FIG. 1, the vacuum evaporation machine comprises an enclosure 1 in which is placed the sample 2 to be covered with a deposit in front of a source 3 subject to an evaporation, supplied by an electric cable 4 and a current generator 5.

Figure 1:
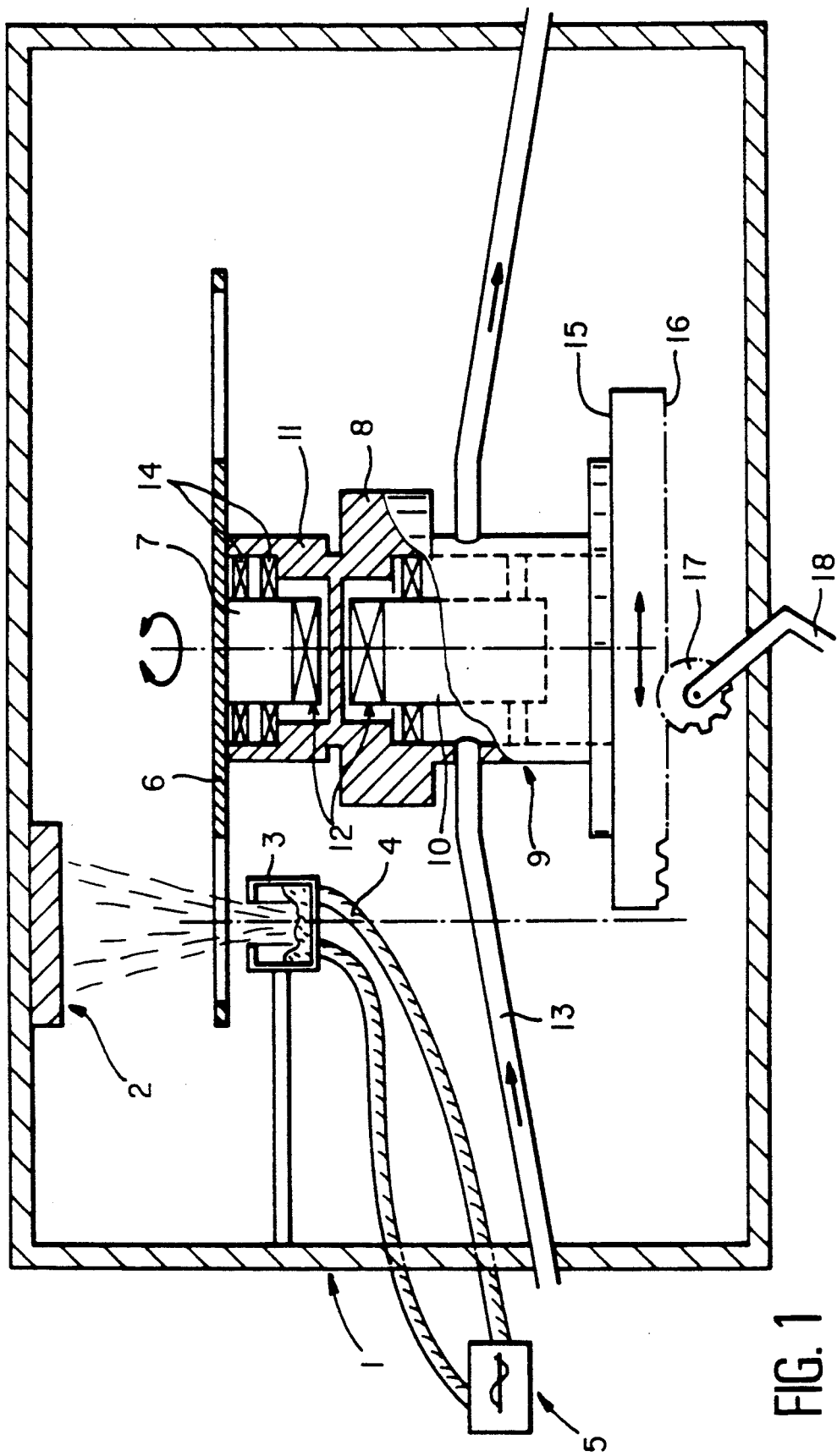
FIG. 1 is a view of a vacuum evaporation coating machine using the apparatus according to the invention, the cover being a disk seen by its edge.

A cover 6 is placed between the sample 2 and the source 3 and much closer to the latter. It is a disk of limited thickness and a shape which will be described hereinafter. In its centre it has a shaft 7, which spins it and which extends at some distance from the source 3. The shaft 7 is placed in a case 8, which contains an electric motor 9. The latter has a drive shaft 10 in the extension of the shaft 7 and which is separated from the latter by a tight partition 11 passing across the interior of the case 8. Thus, there is no mechanical connection between the drive shaft 10 and the shaft 7, but the drive is ensured by permanent magnets 12 located on their facing ends and which are constituted by groups of magnets arranged in ring-like manner and alternating poles positioned so as to produce an attraction force whilst opposing relative rotations.

Ducts 13 traverse the enclosure 1, the case 8 and lead to the electric motor 9. They contain electric supply wires and are traversed by a cooling air current. The electric motor 9 is consequently protected from the high temperature of approximately 300° C. created on the mask or cover 6 by the source 3. The shaft 7 rotates in an open part of the case 8 by means of ballbearings 14, which must not be lubricated with grease and which are covered with a thin molybdenum disulphide film. The balls are made from a ceramic material. The drive shaft 10 can be guided by ordinary ballbearings.

The case 8 is mounted on a table 15 serving as a support and which moves in the enclosure 1 towards the source 3 and away from the latter. It can e.g. be provided with a rack 16, which can be advanced by a pinion 17 controlled by a crank 18, which extends externally of the enclosure 1. It can be seen that the cover 18 is moved in front of the source 3, whilst remaining in the same plane, so as to pass in front of it a circumference with a selected diameter when the motor 9 is started up and the shaft 7 rotates.

The means for sealing the enclosure 1 and for creating the vacuum necessary for deposition under satisfactory conditions are of a conventional, not shown nature. The devices permitting the sliding of the table 15 and which can be constituted by slides or rails fixed to the wall of the enclosure 1 are also not shown.

Figure 2:
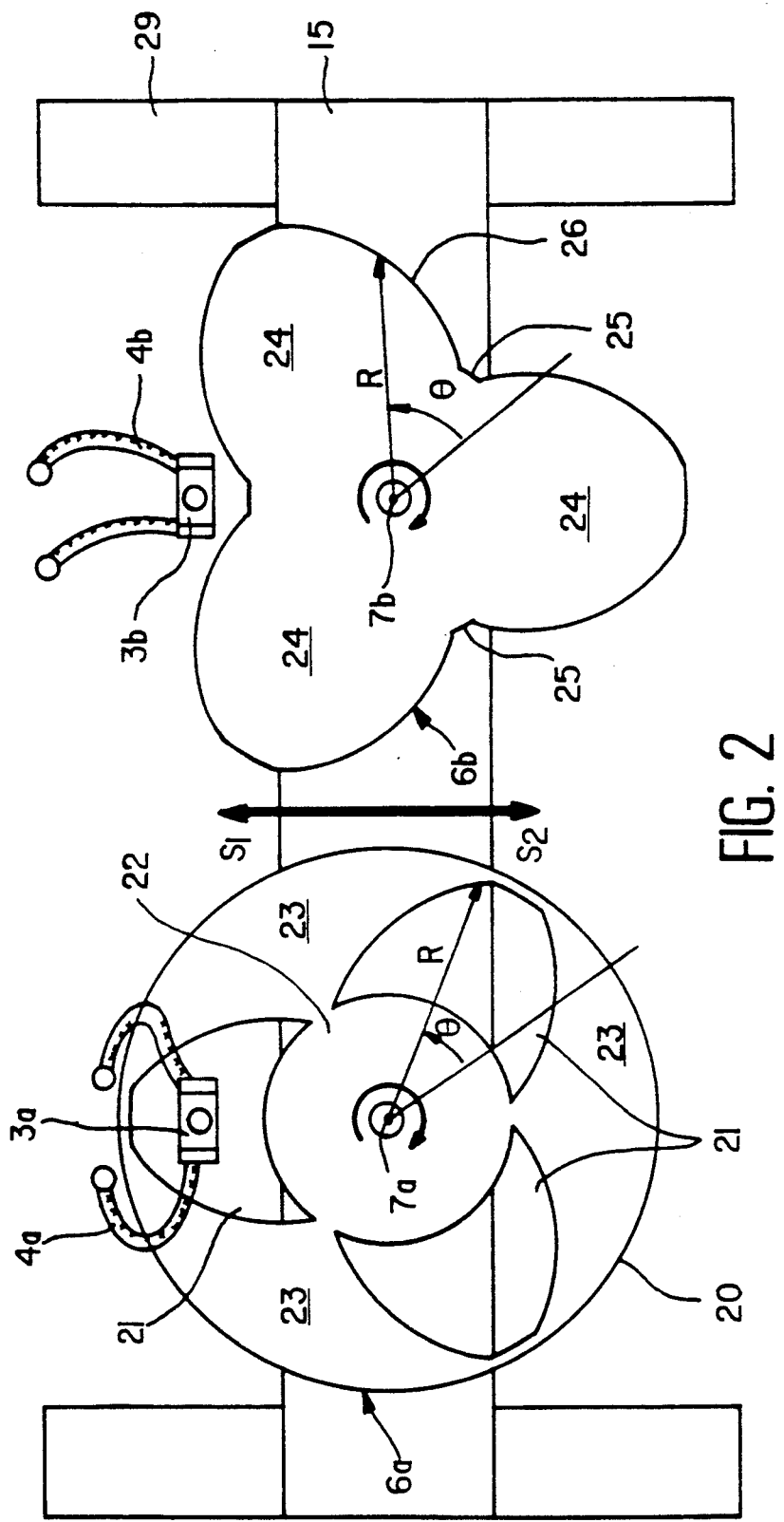
FIG. 2 is a view of an embodiment with two fixed sources, the complementary covers seen from the front being mounted on a support performing a translatory movement.

FIG. 2 illustrates a machine having two fixed sources $3a,3b$ supplied by respective electric cables $4a,4b$ and cooperating with a respective cover $6a$ or $6b$ located on a support 15 performing a translatory movement on the rails 29 and rotating under the effect of a shaft $7a$ or $7b$. Two main shapes for the covers 6 are shown. The first cover $6a$ is a disk having a circular outer contour 20 and which is provided with three lobe-shaped openings 21, whereof the arc extension ceaselessly decreases towards the periphery. The openings meet almost to form a circumference with a relatively small radius, but are then interrupted towards the inside in such a way that the first cover 6a has central surface 22a for connection to the shaft 7a. Three solid portions 23 extend between the openings 21 and meet at the periphery of the first cover 6a in order to form the circular outer contour 20, whilst being in one piece with the central surface 22.

The second cover 6b has a different shape, because it has three solid, lobed portions 24, whose shape is like the openings 21. The solid portions 24 are joined together and extend on the shaft 7b. Cavities 25 between the solid portions 24 form openings on the periphery of the second cover 6b, but which is solid within its contour 26. In the same way as the solid portions 24, the openings 21 are equidistant of the shaft 7 and regularly distributed over the circumference of the covers 6. The openings 21 and the solid portions 24 have identical shapes and sizes.

Figure 3:
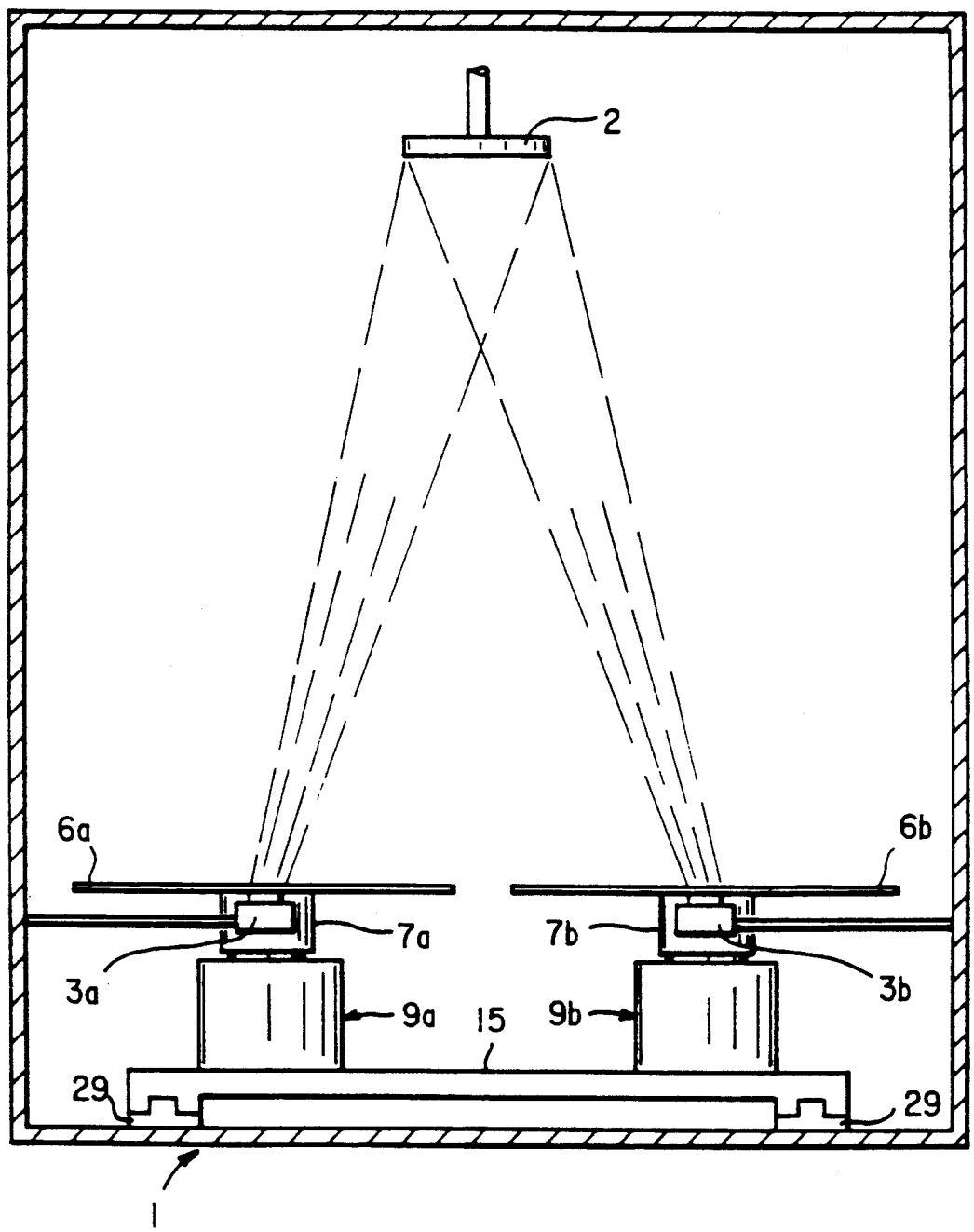
FIG. 3 is a view of a vacuum evaporation coating machine using the apparatus of FIG. 2.

The covers 6a and 6b having complementary shapes rotate independently in the same plane. They can be moved by different motors or by a single motor having two transmission systems joining it to the two shafts 7a and 7b. In this embodiment of the invention shown in FIGS. 2 and 3, both the motors 9a and 9b are fixed to the table 15. The latter slides on rails 29 whilst the sources 3a,3b are stationary. A movement of the table in the direction S1, by a purely radial movement, moves the sources 3a,3b towards the rotation axis of their associated mask. Thus, the source 3a moves away from the circular outer contour 25 of the mask 6a, which increases the passage time of the openings 21 in front of the source 3a and decreases the passage time of the solid portions 23, i.e. the degree of hiding of the source 3a. The source 3b approaches in the same time and by the same quantity the shaft 7b, so that the passage time of the solid portions 24 and its degree of hiding increase. Therefore this apparatus makes it possible to bring about an opposite variation of the degrees of hiding of the sources 3a and 3b, whose sum remains equal to 1 if the lobes of the solid portions 24 are shaped for this purpose. The mixture deposited on the object to be covered has a variable composition and the deposition rate remains constant.

Figure 4:
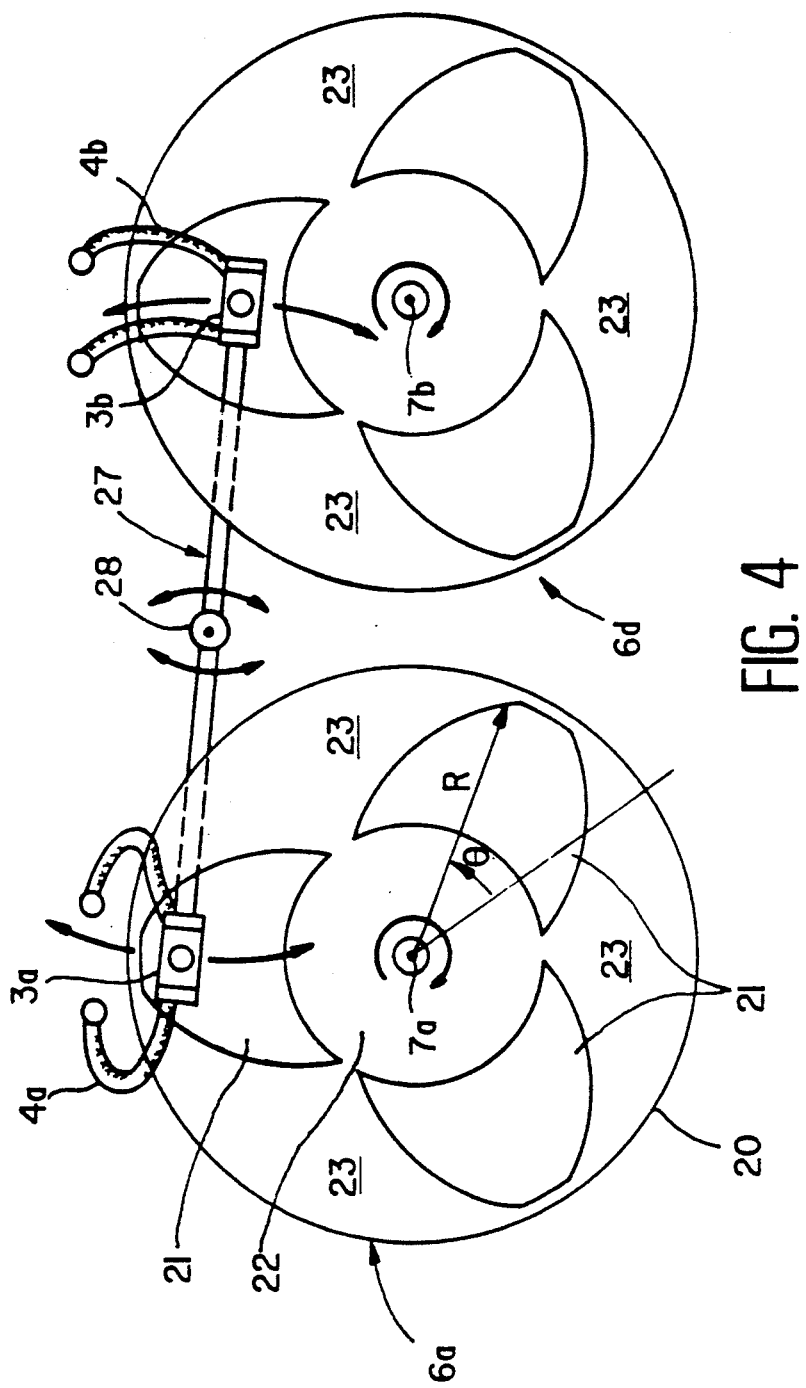
FIG. 4 is a view of an embodiment with two sources, the identical covers seen from the front being in each case rotated about a fixed axis and the two sources perform an oscillatory movement on a circular path.

In another embodiment of the invention shown in FIG. 4, the covers 6c,6d are identical, have the same shape as the cover 6a and are at fixed locations in the enclosure 1, on which they are supported, but the sources 3 are attached to the ends of two arms of a balance or pendulum 27, which extends beneath the covers 6c,6d and which is mobile in its centre about a pivot 28, parallel to the shafts 7, which can be moved from the exterior of the enclosure 1 by a crank or a similar means.

Thus, unlike in the preceding case, instead of being fixed the sources 3a,3b perform an oscillatory movement on a circular path about the axis 28 of the balance 27.

The displacements of the balance 27 move one of the sources 3 away from the shaft 7 of the associated cover and does the opposite with the other source 3, whilst maintaining the sources 3 at a constant distance from the covers 6. A clockwise movement of the balance 27 consequently moves the source 3a radially towards the outer circular contour 20 of the first cover 6c, which reduces the passage time of the openings 21 in front of the source 3a and increases the passage time of the solid portions 23, i.e. the degree of hiding of the source 3a. The source 3b radially approaches in the same time and by the same quantity the shaft 7b, if the axis 28 is equidistant of the two sources 3, so that the passage time of the solid portions 23 and its degree of hiding decrease. Therefore this apparatus permits an opposite variation of the degrees of hiding of the sources 3a,3b, whose sum can remain the same if the lobes of the solid portions 23 are formed or shaped for this purpose. Thus, when the material flows from the sources 6c,6d are identical, the deposition rate remains constant and the mixture deposited on the object to be covered has a composition, whose variation is controlled by the conditions imposed by the shape of the covers and the movement of the balance.

It is clear that covers having different shapes or positioned at different locations would make it possible to vary the degrees of hiding in accordance with other principles, i.e. with different variations, as a function of the sought result and in particular the fineness of the regulation of the composition or the deposition rate of the mixture which is evaporated and then deposited. These results can be achieved by placing the sources 3 at the end of different arm lengths of the balance, by using the covers with lobes or openings of different widths, or by placing the covers on two sides of the balance. It is also possible to use covers 6 and shafts 7 which are detachable and which can be replaced for each machine use. Conversely, it would be possible to fix the sources 3 to the enclosure 1 as in the preceding embodiment and place the covers 6 and their motor 9 on the balance.

A vacuum evaporation deposition machine of the same type can be equipped in the same way with identical covers having the same shape as the cover 6b.

The shapes of the lobes are advantageously chosen in such a way that the variations of the degree of hiding are proportional to the displacements. In the case of translatory movements between the source 3 and the cover 6, this result is achieved if the limits of the openings or lobes are spiral portions (of equation $R = a\theta + b$, in which a and b are constant coefficients, with the conventions of FIG. 2 and in which R and $\theta$ are polar coordinates centered on the shaft 7).

Covers other than rotary disks are possible and endless belts or belts subject to an alternating movement and having a sawtooth contour are possible examples. The fundamental advantages of the invention, namely the ease, precision and fineness of the evaporation flow from the sources towards the object to be covered would be retained.

We claim:

1. Apparatus for controlling a material flow emitted by a source (3) mounted on a support and characterized by a cover constituted by solid portions (23,24) and openings (21,25), a motor (9) making the cover (6) move in front of the source (3) and by another support (1,15) on which are fitted the cover and the motor, one of the supports being mobile with respect to the other, so that it is possible to vary the degree of hiding of the source, defined as the proportion, with respect to the total passage time, of the time during which the solid portions of the cover extend in front of the source.

2. Apparatus according to claim 1, characterized in that the cover is constituted by a disk rotating about a shaft (7) off-centered with respect to the source, the openings being regularly distributed on a circumference of the disk, are identical and positioned around the axis.

3. Apparatus according to claim 2, characterized in that the openings are separated from the solid portions by lobed contours.

4. Apparatus according to claim 3, characterized in that the contours have a shape such that the variations of the degree of hiding are proportional to the displacements of the support.

5. Apparatus according to claim 4, characterized in that the support is mobile in translation with respect to the source and in that the contours are spiral shaped.

6. Apparatus according to claim 1, characterized in that it comprises several sources and the same number of covers moved by motors, a single support on which are fitted all the covers and the motors and another single support on which all the sources are fitted, the covers being designed in such a way that the displacements of the mobile support lead to different variations of the degree of hiding of each source.

7. Apparatus according to claim 6, characterized in that one of the supports is constituted by a table (15) mobile in translation on rails (29), whilst the other support is fixed.

8. Apparatus according to claim 6, characterized in that one of the supports is a balance or beam (27) rotating about an axis (28), whilst the other support is fixed.

9. Apparatus according to claim 6, characterized in that the sources, the covers and the supports are arranged in such a way that all the sources are exposed to relative movements of the same amplitude with respect to the covers.

10. Apparatus according to claim 9 in which there are two sources, which are respectively associated with two covers, characterized in that the covers are identical and the sources are subject to radial displacements in opposite directions with respect to the associated cover (FIG. 4).

11. Apparatus according to claim 9, in which there are two sources respectively associated with two covers, characterized in that the covers are formed with the openings of one of the covers identical to the solid parts of the other of the covers and the sources are exposed to radial displacements in the same direction relative to the associated cover (FIG. 2).

12. Vacuum evaporation coating machine, characterized in that the vacuum enclosure (1) containing the sample (2) to be coated is equipped with a flow control apparatus according to claim 1.

* * * * *